United States Patent [19]

Takemae et al.

[11] Patent Number: 4,458,337
[45] Date of Patent: Jul. 3, 1984

[54] BUFFER CIRCUIT

[75] Inventors: Yoshihiro Takemae, Yokohama; Shigeki Nozaki, Kawasaki; Isutomu Mezawa, Aizuwakamatsu; Katsuhiko Kabashima, Kawasaki; Seiji Enomoto, Yokohama, all of Japan

[73] Assignee: Fujitsu Limited, Kawasaki, Japan

[21] Appl. No.: 354,498

[22] Filed: Mar. 3, 1982

[30] Foreign Application Priority Data

Mar. 5, 1981 [JP] Japan ................................... 56-31752

[51] Int. Cl.$^3$ ............................................. G11C 13/00
[52] U.S. Cl. ..................................... 365/189; 365/233
[58] Field of Search ......................... 365/189, 230, 233

[56] References Cited

U.S. PATENT DOCUMENTS 4,038,567 7/1977 Lewis et al.
4,053,873 10/1977 Freeman et al.

FOREIGN PATENT DOCUMENTS 2028043 2/1980 United Kingdom.

Primary Examiner—Terrell W. Fears
Attorney, Agent, or Firm—Staas & Halsey

[57] ABSTRACT

A buffer circuit comprises a flip-flop which is receives an external input via a first input circuit and a reference voltage via a second input circuit. Internal complementary outputs are then produced via an output circuit. The flip-flop cooperates with at least one level setting device by way of a second input circuit. The level setting device functions to produce a voltage level to deactivate the second input circuit during activation of the flip-flop.

6 Claims, 5 Drawing Figures

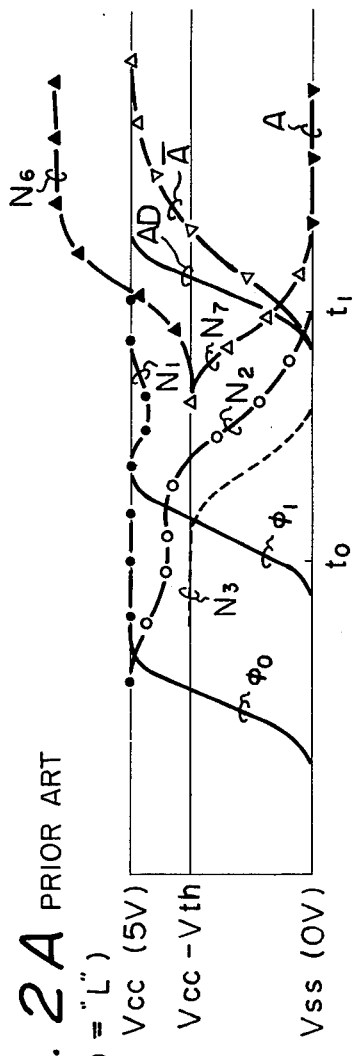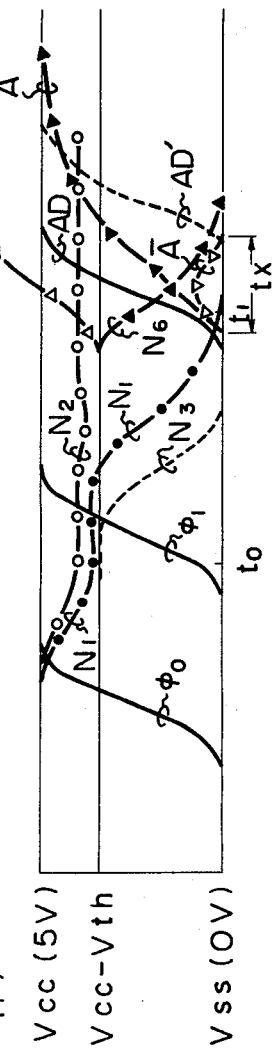
Fig. 2A PRIOR ART (ADD = "L")
Fig. 2B PRIOR ART (ADD = "H")

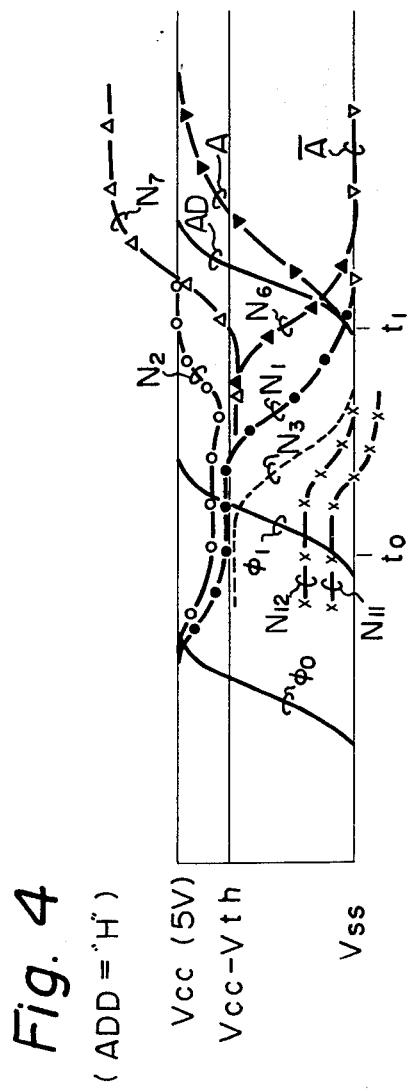
Fig. 4 (ADD="H")

BUFFER CIRCUIT

BACKGROUND OF THE INVENTION

The present invention relates to a buffer circuit, more particularly, to a buffer circuit including a flip-flop which receives an external input and produces complementary outputs thereof.

The above-mentioned buffer circuit is currently used, for example, in the input stage of data input circuits and the input stage of memory circuits, as an address buffer. The present invention, applicable to various other buffer circuits as well, will be explained in reference to address buffers.

Address buffers are incorporated into dynamic memories at their input stages to supply complementary addresses to decoders for accessing a desired memory cell in the memory. Such address buffers are mainly comprised of flip-flops provided with a pair of input-/output terminals. The flip-flops receive an external address at one of the input terminals and produce complementary external addresses at the output terminals.

Buffer circuits currently used suffer from a defect in that the flip-flop cannot be changed to a stable state quickly. It is necessary to wait a certain amount of time until the flip-flop is completely in its stable state with the result that complementary external addresses cannot be produced in a short time. The reason for this will be clarified hereinafter. If such a buffer circuit is used as an address buffer in a dynamic memory, it would prevent the memory from operating at a high speed.

SUMMARY OF THE INVENTION

It is an object of the present invention to provide a buffer circuit which can overcome the problem of not being able to operate at high speed and can produce complementary outputs in a short time. The buffer circuit comprises a flip-flop which receives an external input from a first input circuit and a reference voltage from a second input circuit. Internal complementary outputs are produced at an output circuit. The flip-flop cooperates with at least one level setting device connected to the second input circuit. The level setting device functions to produce a voltage level to deactivate the second input circuit during activation of the flip-flop.

The present invention will be more apparent from the ensuing description with reference to the accompanying drawings.

BRIEF DESCRIPTION OF THE DRAWINGS

FIG. 2A is a timing diagram used for explaining the operation of the address buffer when an external address ADD of logic "L" is supplied thereto;

FIG. 2B is a timing diagram used for explaining the operation of the address buffer when an external address ADD of logic "H" is supplied thereto;

FIG. 4 is a timing diagram used for explaining the operation of the address buffer shown in FIG. 3.

DESCRIPTION OF THE PREFERRED EMBODIMENT

Figure 1:
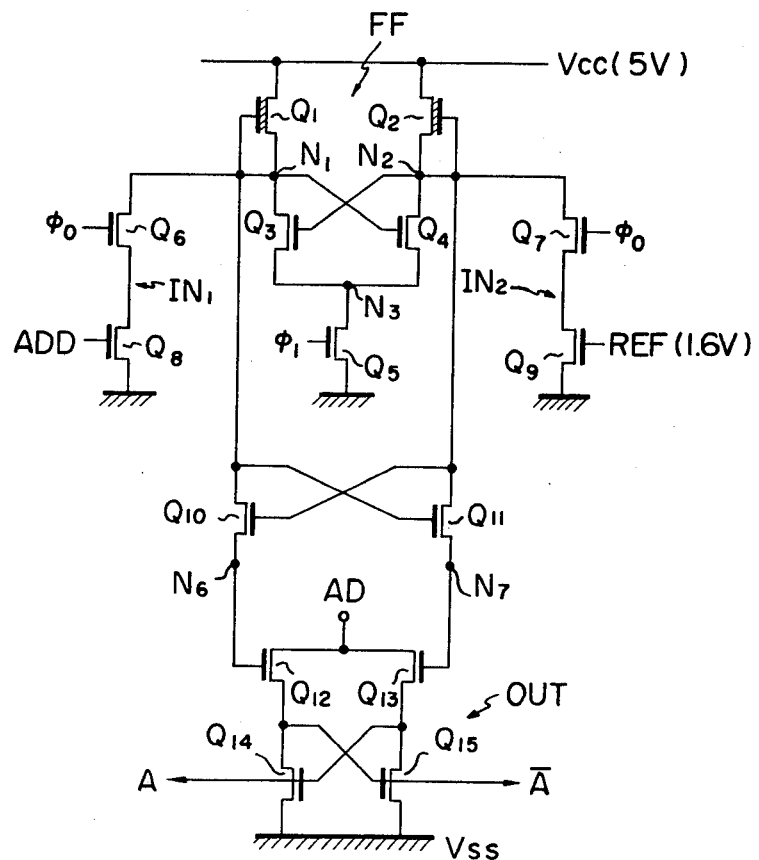
FIG. 1 is a circuit diagram of a prior art buffer circuit.

FIG. 1 is a circuit diagram of a prior art buffer circuit. As previously mentioned, the buffer circuit will be explained in reference to an address buffer of a dynamic memory. The address buffer is comprised of a flip-flop FF, a first input circuit $IN_1$, a second input circuit $IN_2$, and an output circuit OUT. At the first input circuit $IN_1$, the address buffer receives an external address ADD and produces complementary outputs, that is, complementary addresses A and $\overline{A}$. If an external address ADD having a logic "H" (high) is supplied, an address A of logic "H" and an inverted address $\overline{A}$ of a logic "L" (low) are simultaneously produced and then transferred to the decoders of the memory. The external address ADD usually has a transistor-transistor logic (TTL) level of 2.4 V as "H" and a TTL level of 0.8 V as "L". The produced addresses A and $\overline{A}$ have a metal-oxide semiconductor (MOS) level of $V_{cc}$, such as 5 V, as logic "H", and an MOS level of $V_{ss}$, such as 0V, as logic "L". The operations of the address buffer will be explained with reference to FIGS. 2A and 2B. The flip-flop FF is comprised of MOS transistors $Q_1$, $Q_2$ (both depletion MOS transistors), $Q_3$, and $Q_4$ so that it is formed as a main amplifier. The flip-flop FF includes therein a pair of input/output terminals at nodes $N_1$ and $N_2$. Node $N_1$ is coupled to the first input circuit $IN_1$, and node $N_2$ is coupled to the second input circuit $IN_2$. At the same time, nodes $N_1$ and $N_2$ are coupled to the output circuit. The first input circuit $IN_1$ is formed by an MOS transistor $Q_6$ for receiving, at its gate, a first clock $\phi_0$ for activating the first input circuit $IN_1$ (also the second input circuit $IN_2$) and an MOS transistor $Q_8$ for receiving, at its gate, the external address ADD. Both MOS transistors are connected in series. On the other hand, the second input circuit $IN_2$ is formed by an MOS transistor $Q_7$ for receiving, at its gate, the first clock $\phi_0$ and an MOS transistor $Q_9$ for receiving, at its gate, a reference voltage REF, such as 1.6 V. Both MOS transistors are connected in series. The size of each of the transistors $Q_1$ through $Q_4$ and $Q_6$ through $Q_9$ is determined to form a symmetrical relationship, that is $SQ_1=SQ_2$, $SQ_3=SQ_4$, $SQ_6=SQ_7$, and $SQ_8=SQ_9$, wherein each symbol S denotes the sizes of transistors.

When the first clock $\phi_0$ for activating the first and second input circuits $IN_1$ and $IN_2$ is generated, the voltage levels $VN_1$ and $VN_2$ at the nodes $N_1$ and $N_2$ become slightly unbalanced due to the logic of the external address ADD. If the logic of the address ADD is "H" (or "L"), the imbalance may specifically be represented as $VN_1=2.4$ V $> VN_2=1.6$ V (or $VN_1=0.8$ V $< VN_2=1.6$ V). The slightly unbalanced state is converted into a large unbalanced state when the flip-flop FF is activated. The flip-flop FF is activated when a second clock $\phi_1$ is generated. Clock $\phi_1$ makes MOS transistor $Q_5$ conductive, thereby grounding a node $N_3$, which is common to each source of the transistors $Q_3$ and $Q_4$. Thus, the flip-flop FF functions as a main voltage amplifier.

FIG. 2A is a timing diagram used for explaining the operation of the address buffer when an external address ADD of logic "L" is supplied thereto. FIG. 2B is a timing diagram used for explaining the operation of the address buffer when an external address ADD of logic "H" is supplied thereto. Referring to FIGS. 1 and 2A, even though the first clock $\phi_0$ is generated, the voltage level $VN_1$ at the node $N_1$ is still maintained at nearly the level of $V_{cc}$ because the transistor $Q_8$ is turned OFF by the address ADD of logic "L". On the other hand, in the second input circuit $IN_2$, the transistor $Q_9$ is usually designed to always be conductive by the reference voltage REF (1.6 V). Accordingly, when the first clock $\phi_0$ is generated and the transistor $Q_7$ is turned ON, a current starts flowing through the transistors $Q_2$, $Q_7$, and $Q_9$. Thus, the voltage level $VN_2$ at the node is changed to a certain level which is lower than the level $V_{cc}$ but higher ($V_{cc}-V_{th}$), where the symbol $V_{th}$ denotes a threshold voltage level, and the relationship $VN_1 > VN_2$ is obtained. Under this condition, the second clock $\phi_1$ is generated. As previously explained, the clock $\phi_1$ makes the transistor $Q_5$ conductive, and, therefore, the flip-flop FF is activated. Since the relationship $VN_1 > VN_2$ stands, the transistor $Q_3$ is turned OFF and at the same time the transistor $Q_4$ is turned ON. Thereafter, the voltage level $VN_1$ is kept at the level $V_{cc}$ while the voltage $VN_2$ is further reduced to the level $V_{ss}$, which means that the small voltage difference between the initial values of $VN_1$ and $VN_2$ is amplified by means of the flip-flop (main amplifier) FF.

Regarding nodes $N_6$ and $N_7$, the voltage levels $VN_6$ and $VN_7$ are initially precharged to the same level of $V_{cc}-V_{th}$ via MOS gate transistors $Q_{10}$ and $Q_{11}$, respectively. However, now the level $VN_1$ at the node $N_1$ is kept at the level $V_{cc}$ and the level $VN_2$ at the node $N_2$ is changed to the level $V_{ss}$, the gate transistor $Q_{10}$ is turned OFF and, at the same time, the gate transistor $Q_{11}$ is turned ON. Accordingly the electric charges at the node $N_7$ are discharged to ground ($V_{ss}$) via the transistors $Q_{11}$, $Q_4$, and $Q_5$, and thus the voltage level $VN_7$ at the node $N_7$ is changed to the level $V_{ss}$. On the other hand, the electric charges at node $N_6$ remain as they are, because the gate transistor $Q_{10}$ is now cut off. Next, the voltage level $VN_6$ is changed when a drive signal AD is generated. To be specific, when the drive signal AD having the level of $V_{cc}$ is supplied to an MOS transistor $Q_{12}$ (also an MOS transistor $Q_{13}$), the voltage level $VN_6$ is increasingly shifted in level due to the creation of the bootstrap effect caused by the presence of the transistor $Q_{12}$. Thus the voltage level at the node exceeds the level $V_{cc}$, as seen from the characteristic curve $N_6$ in FIG. 2A. This causes an MOS transistor $Q_{15}$ to be conductive and, at the same time, an MOS transistor $Q_{14}$ to be nonconductive. Transistors $Q_{12}$ through $Q_{15}$ form the output circuit OUT. As a result, the address A of the logic "L" having the level $V_{ss}$ and the inverted address $\overline{A}$ of logic "H" having the level $V_{cc}$ are produced from the output circuit OUT.

However, when an external address ADD having the logic "H" is supplied to the address buffer, the circuit of FIG. 1 operates in accordance with the timing diagram shown in FIG. 2B. It should be noted that the aforementioned defect is produced with the supply of an external address ADD of logic "H", but not logic "L". First, as mentioned above, the first clock $\phi_0$ is generated and, accordingly, the transistor $Q_6$ is turned ON. Also, the transistor $Q_8$ is turned ON by the address ADD of logic "H". In this case, since the gate voltage of the transistor $Q_8$, that is, 2.4 V, is higher than that of the other transistor $Q_9$, that is, 1.6 V, the relationship $VN_1 < VN_2$ stands ($VN_1$ and $VN_2$ are the voltage levels at the nodes $N_1$ and $N_2$, respectively). The reason why the relationship $VN_1 < VN_2$ stands is that the mutual conductance $g_m$ of the transistor $Q_8$ becomes larger than that of the transistor $Q_9$, because, generally, the mutual conductance is large or small in accordance with a condition where the gate voltage is high or low, respectively.

Next, as previously explained, the second clock $\phi_1$ is generated, and, the flip-flop FF is activated. The voltage level $VN_1$ at the node $N_1$ is reduced to the level $V_{ss}$. In this case, the voltage level $VN_2$ at the node $N_2$ is necessarily set to be higher than the level $VN_1$. However, it is important to note that the voltage level $VN_2$ is not the same or higher than the corresponding level $VN_1$ ($V_{cc}$) when the address ADD is logic "L" (compare the characteristic curves $N_1$ in FIG. 2A and $N_2$ in FIG. 2B) and $\phi_0$ is applied. This is because, in the second input circuit $IN_2$, both transistors $\phi_7$ and $\phi_9$ are conductive after the first clock $\phi_1$ is generated (as previously mentioned the transistor $Q_9$ is normally made conductive). Therefore, the mutual conductance $g_m$ of the gate transistor $Q_{10}$ is relatively small as compared with that of the gate transistor $Q_{11}$ during the supply of the address ADD having logic "L". Since the $g_m$ of the gate transistor $Q_{10}$ when ADD="H" is smaller than that of the gate transistor $Q_{11}$ when ADD="H", it takes a considerably longer time to discharge the electric charges at the node $N_6$ to ground ($V_{ss}$). In other words, residual electric charges exist for a while at the node $N_6$. Such residual electric charges cause the transistor $Q_{12}$ to be unnecessarily turned ON for a while after the drive signal AD is generated. Since the transistor $Q_{12}$ is unnecessarily turned ON for a while (see time $t_x$ in FIG. 2B), an undesired level shift is produced in the address $\overline{A}$, although address $\overline{A}$ should be maintained at logic "L" ($V_{ss}$). The undesired level shift in the address $\overline{A}$ is illustrated as a mountainshape characteristic curve $\overline{A}$ during the time $t_x$. In this case, there is no trouble regarding the level of the address A ($V_{cc}$). In the prior art, to eliminate such an undesired level shift from the address $\overline{A}$, the drive signal AD must be generated with a certain time delay corresponding to time $t_x$. The delayed drive signal AD is depicted by dotted line characteristic curve AD' in FIG. 2B. Such delay of time, however, causes the previously mentioned defect of preventing the memory from operating at a high speed.

Figure 3:
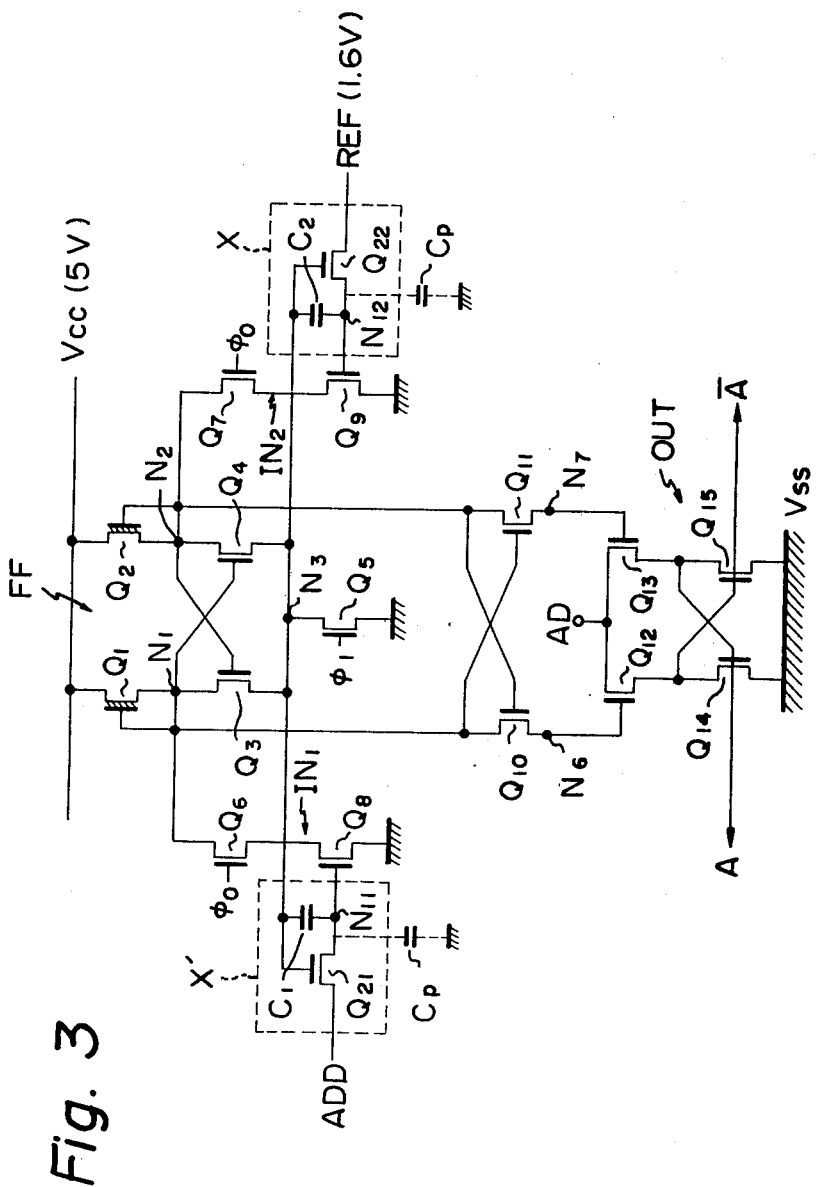
FIG. 3 is an example of a circuit diagram of a buffer circuit according to the present invention.

The present invention can overcome the above-mentioned defect by preventing the undesired level shift in the address A. FIG. 3 illustrates one example of a circuit diagram of a buffer circuit according to the present invention. The buffer circuit is illustrated in reference to an address buffer, as in FIG. 1. The members in FIG. 3 which are identical to those in FIG. 1 are referenced by the same reference symbols as in FIG. 1. A level setting device X and a level setting device X' are newly employed. Although a pair of devices (X, X') is shown in FIG. 3, the present invention is effective with just device X and without device X' in the address buffer. However in actual use, it is preferable to mount the same load (X, X') seen from each of the nodes $N_1$ and $N_2$ in view of circuit balance. The level setting device X functions to supply a certain voltage level to deactivate the second input circuit $IN_2$ during the activation of the flip-flop FF. The level setting device X' functions identically to the device X during the activation of the flip-flop FF with respect to the first input circuit $IN_1$. Prior to the activation of the flip-flop FF, the devices X and X' function to transfer, respectively, the reference voltage REF to the circuit $IN_2$ and the address ADD to the circuit $IN_1$. In the example of FIG. 3, the level setting device X is comprised of an MOS transistor $Q_{22}$ and a capacitor $C_2$, while the level setting device X' is comprised of an MOS transistor $Q_{21}$ and a capacitor $C_1$. Each of these devices X and X' must be effective only during the activation of the flip-flop FF, that is, during the generation of the second clock $\phi_1$. Therefore, in the example of FIG. 3, each level setting device receives the voltage $VN_3$ at the node $N_3$ which is common to the source of the transistors $Q_3$ and $Q_4$. After the first clock $\phi_0$ is generated but before the second clock $\phi_1$ is generated, the address ADD of logic "H" is supplied to the gate of transistor $Q_8$ as in the buffer of FIG. 1, but via the transistor $Q_{21}$ and a node $N_{11}$. This is also true in the case where ADD = "L". During the same period mentioned above, the reference voltage REF is supplied to the gate of transistor $Q_9$ as in the buffer of FIG. 1, but via the transistor $Q_{22}$ and a node $N_{12}$.

The above-mentioned construction is useful for eliminating the aforementioned undesired level shift in the address $\overline{A}$ (refer to the term $t_x$ in FIG. 2B), especially when the external address ADD appears with the logic "H" and not "L". This will be clarified with reference to FIG. 4.

FIG. 4 is a timing diagram used for explaining the operation of the address buffer shown in FIG. 3. The address ADD of logic "H" is supplied to the address buffer. Since the address ADD has a logic "H", when the first clock $\phi_0$ is generated, transistors $Q_6$ through $Q_9$ are all made conductive. Therefore, a current flows through the transistors $Q_1$, $Q_6$, and $Q_8$, and, at the same time, another current flows through the transistors $Q_2$, $Q_7$, and $Q_9$. In addition, the relationship $VN_1 < VN_2$ stands, because, as previously mentioned, the gate voltage (2.4 V) of the transistor $Q_8$ is slightly higher than that of the transistor $Q_9$ (1.6 V). Under such a condition, the second clock $\phi_1$ is generated at a time $t_0$ (see FIG. 4), and, accordingly, the transistor $Q_5$ is turned ON. Thus the flip-flop FF is activated and the transistors $Q_3$ and $Q_4$ are turned ON and OFF, respectively, in accordance with the relationship $VN_1 < VN_2$. Then, the voltage level $VN_1$ at the node $N_1$ is reduced to the level $V_{ss}$ via the transistors $Q_3$ and $Q_5$ (see the characteristic curve $N_1$ in FIG. 4). The voltage level $VN_2$ at the node $N_2$ is maintained at a certain level slightly lower than the level $V_{cc}$ due to the current flowing through the transistor $Q_9$ (see the characteristic curve $N_2$ before the time $t_0$ in FIG. 4). Such reduction of the level $VN_2$ induces the aforementioned defect in the prior art. However, in the present invention, the level setting device X, compensates for such a reduction of the level $VN_2$. The operation is as follows.

When the second clock $\phi_1$ is generated and the flip-flop FF is activated, the voltage level $VN_3$ at the node $N_3$ is reduced to the level $V_{ss}$. This level reduction at the node $N_3$ is fed back, via the capacitor $C_2$, to the node $N_{12}$. This level reduction is also introduced to the gate of the transistor $Q_{22}$ and makes it nonconductive. Therefore, the reference voltage REF is no longer supplied to the transistor $Q_9$. In this case, although the gate of the transistor $Q_9$ is completely isolated from the reference voltage REF, it is very likely to turn ON this transistor $Q_9$, due to the residual electrical charges stored in the parasitic capacitor $C_p$ neighboring the node $N_{12}$. Accordingly, a voltage is developed at the node $N_{12}$. This voltage can be suppressed by the voltage level reduction at the node $N_3$ via the capacitor $C_2$. Thus the transistor $Q_9$ can be completely cut off. The level reduction at the node $N_{12}$ is depicted in FIG. 4 as the characteristic curve $N_{12}$. Similarly, a level reduction at the node $N_{11}$ is depicted in this figure as the characteristic curve $N_{11}$. As a result, no current flows through the transistors $Q_2$, $Q_7$, and $Q_9$, unlike in the address buffer in FIG. 1, and the voltage level $VN_2$ at the node $N_2$ can be pulled up to the level $V_{cc}$ (compare the characteristic curve $N_2$ after the time $t_0$ in FIG. 4 with the corresponding curve $N_2$ in FIG. 2B). Since the voltage level at the node $N_2$ is maintained at the level $V_{cc}$, and not at a level between $V_{cc}$ and $V_{cc}-V_{th}$, the mutual conductance $g_m$ of the transistor $Q_{10}$ shown in FIG. 4 can be considerably increased as compared with that of the transistor $Q_{10}$ shown in FIG. 1. This means that the electric charges at the node $N_6$ are discharged to ground very quickly through the transistors $Q_{10}$ and $Q_3$. Thus, the mountain shape curve $\overline{A}$ during the time $t_x$ in FIG. 2B no longer occurs. Therefore, in FIG. 2B, the generation of the drive signal AD can be made faster than the signal AD' of the prior art by the time $t_x$. That is, the drive signal AD can be generated at the time $t_1$ (refer to FIGS. 2B and 4). This is because, the voltage level at the node $N_2$ is maintained at the highest level $V_{cc}$ after the time $t_0$, with the result that the transistor $Q_{12}$ can no longer be conductive at any time thereafter. Thus, the internal inverted address $\overline{A}$ can be maintained continuously at the level $V_{ss}$.

On the other hand, regarding the internal address A, although the first input circuit $IN_1$ is deactivated by the level setting device X', there is no trouble in producing the desired address A. This is because the first input circuit $IN_1$ is deactivated only during the activation of the flip-flop FF. Prior to the activation of the flip-flop FF, but after the generation of the first clock $\phi_0$, the voltage level at the node $N_1$ has already been determined at the level of nearly $V_{cc}-V_{th}$. Therefore, after the second clock $\phi_1$ is generated, the voltage level at the node $N_1$ is reduced to the level of $V_{ss}$, even though the first input circuit $IN_1$ is deactivated by the device X'. In this case, the residual electric charges are left as they are at the node $N_7$, because the gate transistor $Q_{11}$ is turned OFF by the voltage level $VN_1$ equal to $V_{ss}$. The voltage level $VN_7$ is then pushed up, when the drive signal AD is generated, by the bootstrap effect (refer to the characteristic curve $N_7$ in FIG. 4). It should be noted that since the first and second input circuits $IN_1$ and $IN_2$ are deactivated by the devices X' and X, respectively, less power is consumed due to currents flowing through the circuits $IN_1$ and $IN_2$, especially during the activation of the flip-flop FF by the second clock $\phi_1$.

The operation of the address buffer in FIG. 3 was explained with reference to the case where the external address ADD has logic "H", with reference to FIG. 4. However, when an address ADD has logic "L", the address buffer operates as if there were no such level setting devices X and X'. In this case, it should again be noted that the previously mentioned defect does not occur when the logic of the address ADD is "L" as opposed to "H". However, when ADD = "L", it is still possible to reduce the power consumed by the circuits $IN_1$ and $IN_2$ during the activation of the flip-flop FF.

As explained hereinbefore in detail, the buffer circuit of the present invention is useful to realize a high operating speed. In addition, the buffer circuit of the present invention is advantageous in requiring lower power consumption.

We claim:

1. A buffer circuit, operatively connected to receive an external signal, first and second clock signals, and a reference voltage, for producing internal complementary outputs, comprising:
a flip-flop having a first input/output terminal and a second input/output terminal and operatively connected to receive the second clock signal;
a first input circuit, operatively connected to said first input/output terminal and operatively connected to receive the external signal and the first clock signal, said first input circuit activated by the first clock signal and comprising:
- a first transistor, operatively connected to said first input/output terminal, having a gate for receiving the first clock signal; and
- a second transistor, operatively connected in series with said first transistor, having a gate for receiving the external signal;
- a second input circuit operatively connected to said second input/output terminal and operatively connected to receive the reference voltage and the first clock signal, said second input circuit being activated by the first clock signal and comprising:
  - a third transistor, operatively connected to said second input/output terminal, having a gate for receiving the first clock signal; and
  - a fourth transistor, operatively connected in series with said third transistor, having a gate for receiving the reference voltage;
- an output circuit, operatively connected to said first and second input/output terminals, for producing complementary outputs upon receipt of the second clock signal by said flip-flop; and
- a first level setting device, operatively connected to the second input circuit, for supplying a voltage level to deactivate said second input circuit when said flip-flop receives the second clock signal.

2. A buffer circuit as set forth in claim 1, further comprising a second level setting device, operatively connected to said first input circuit, for supplying a voltage level to deactivate said first input circuit when said flip-flop receives the second clock signal.

3. A buffer circuit as set forth in claim 1, wherein said first level setting device comprises:
- a fifth transistor having a gate, having a drain operatively connected to receive the external signal, and having a source operatively connected to said gate of said second transistor and operatively connected to ground when said flip-flop receives the second clock signal; and
- a first capacitor having a first terminal operatively connected to said gate of said fifth transistor and having a second terminal operatively connected to said gate of said second transistor and said source of said fifth transistor.

4. A buffer circuit as set forth in claim 2, wherein said second level setting device comprises:
- a sixth transistor having a gate, having a drain operatively connected to receive the reference voltage, and having a source operatively connected to said gate of said fourth transistor and operatively connected to ground when said flip-flop receives the second clock signal and
- a second capacitor having a first terminal operatively connected to said gate of said sixth transistor and having a second terminal operatively connected to said gate of said fourth transistor and said source of said sixth transistor.

5. A buffer circuit as set forth in claim 3, further comprising a seventh transistor having a gate operatively connected to receive the second clock signal, and having a drain and a source, either of which is operatively connected to ground, wherein said flip-flop is operatively connected to said seventh transistor, said seventh transistor selectively connecting said flip-flop and said first terminal of said first capacitor to ground upon receipt of the second clock signal.

6. A buffer circuit as set forth in claim 4, further comprising a seventh transistor having a gate operatively connected to receive the second clock signal, and having a drain and a source, either of which is operatively connected to ground, wherein said flip-flop is operatively connected to said seventh transistor, said seventh transistor selectively connecting said flip-flop and said first terminal of said second capacitor to ground upon receipt of the second clock signal.

* * * * *

UNITED STATES PATENT AND TRADEMARK OFFICE
CERTIFICATE OF CORRECTION

PATENT NO. : 4,458,337
DATED : JULY 3, 1984
INVENTOR(S) : YOSHIHIRO TAKEMAE ET AL.

It is certified that error appears in the above-identified patent and that said Letters Patent is hereby corrected as shown below:

FRONT PAGE [75] Inventors line 2, "Isutomu" should be --Tsutomu--;

[57] ABSTRACT
        line 1, delete "is".

Col. 2, line 47, "$VN_1=2.4$ V >$VN_2=1.6$ V" should be --$VN_1=2.4V>VN_2=1.6V$--.

Col. 3, line 5, "$(V_{cc}-V_{th})$" should be --than $V_{cc}-V_{th}$--.

Col. 6, line 12, delete ",".

Col. 8, line 15, "signal and" should be --signal; and--.

Signed and Sealed this

*Fifth* Day of *March 1985*

[SEAL]

*Attest:*

DONALD J. QUIGG

*Attesting Officer*    *Acting Commissioner of Patents and Trademarks*